(12) United States Patent
Naito et al.

(10) Patent No.: US 6,811,897 B2
(45) Date of Patent: Nov. 2, 2004

(54) INK FOR FORMING A HOLE INJECTION LAYER OF ORGANIC EL DISPLAY DEVICES AND MANUFACTURING METHOD THEREOF, ORGANIC EL DISPLAY DEVICES, AND MANUFACTURING METHOD OF THE SAME

(75) Inventors: Katsuyuki Naito, Tokyo (JP); Naoko Kihara, Matsudo (JP); Rei Hasegawa, Yokohama (JP); Shintaro Enomoto, Yokohama (JP); Yutaka Nakai, Yokohama (JP); Kazushige Yamamoto, Yokohama (JP); Hiroki Iwanaga, Yokohama (JP); Kimito Sakai, Funabashi (JP); Yasushi Mori, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/395,253

(22) Filed: Mar. 25, 2003

(65) Prior Publication Data

US 2004/0018386 A1 Jan. 29, 2004

(30) Foreign Application Priority Data

Mar. 29, 2002 (JP) ........................... 2002-097913
May 21, 2002 (JP) ........................... 2002-146561
May 21, 2002 (JP) ........................... 2002-146562

(51) Int. Cl.$^7$ .................... H05B 33/12; H01B 1/12
(52) U.S. Cl. ................ 428/690; 428/917; 313/504; 313/506; 257/88; 106/287.2; 427/66; 252/500
(58) Field of Search ................. 428/690, 917; 313/504, 506; 257/88; 106/287.2; 427/66; 252/500

(56) References Cited

U.S. PATENT DOCUMENTS 5,300,575 A * 4/1994 Jonas et al. .............. 525/186

FOREIGN PATENT DOCUMENTS

| JP | 63-264692 | 11/1988 |
|---|---|---|
| JP | 63-295695 | 12/1988 |
| JP | 01-243393 | 9/1989 |
| JP | 01-245087 | 9/1989 |
| JP | 2001-155858 | 6/2001 |

OTHER PUBLICATIONS

Groenendaal, L.B. et al., "Poly(3,4-ethylenedioxythiophene) and Its Derivatives: Past, Present, and Future", Adv. Mater. 2000, vol. 12, No. 7, pp. 481–494, 2000.

* cited by examiner

Primary Examiner—Dawn Garrett
(74) Attorney, Agent, or Firm—Finnegan, Henderson, Farabow, Garrett & Dunner, L.L.P.

(57) ABSTRACT

There is disclosed an organic electro luminescence display device comprising a two-dimensional array of pixels comprising organic electro luminescence elements capable of emitting a of color or different plural colors, each of the organic electro luminescence elements being provided with an anode, a cathode, a polymeric luminescence layer located between the anode and the cathode, and a hole injection layer. The hole injection layer is constituted by solid matters containing a donor molecule comprising polythiophene and/or a derivative thereof, and an acceptor molecule comprising polystyrenesulfonic acid and/or a derivative thereof, a concentration of sulfate ion in the hole injection layer is 125 ppm or less, and components having a molecular weight of 110,000 or less is 35% or less based on an entire solid matters, the molecular weight being converted as sodium polystyrenesulfonate in an aqueous gel permeation chromatography measured by using UV of 254 nm in wavelength.

18 Claims, 4 Drawing Sheets

INK FOR FORMING A HOLE INJECTION LAYER OF ORGANIC EL DISPLAY DEVICES AND MANUFACTURING METHOD THEREOF, ORGANIC EL DISPLAY DEVICES, AND MANUFACTURING METHOD OF THE SAME

CROSS-REFERENCE TO RELATED APPLICATIONS

This application is based upon and claims the benefit of priority from the prior Japanese Patent Applications No. 2002-097913, filed Mar. 29, 2002; No. 2002-146561, filed May 21, 2002; and No. 2002-146562, filed May 21, 2002, the entire contents of all of which are incorporated herein by reference.

BACKGROUND OF THE INVENTION

1. Field of the Invention

The present invention relates to an ink for forming a hole injection layer of an organic EL (electro luminescence) display device, which makes it possible to manufacture an organic EL display device excellent in luminance and in long life, and to the method of preparing such an ink. The present invention also relates to a method of manufacturing an organic EL display device by using the aforementioned ink, and to the organic EL display device thus manufactured.

2. Description of the Related Art

Recently, an electro luminescence (EL) element where a multi-layer film formed of an organic material is employed is attracting many attentions (for example, Japanese Patent Unexamined Publications (Kokai) S63-264692; S63-295695; H1-243393; and H1-245087). This organic EL element has been conventionally manufactured mainly by two kinds of manufacturing methods, i.e. a manufacturing method using the vacuum deposition of a low molecular weight material, and a manufacturing method using the coating of a polymer solution. Among them, the latter method is advantageous in that it is suited for easily forming a large display area and, in particular, suited for manufacturing a full color display with high resolution and large size of the picture plane by using an ink jet process.

In a polymer organic EL element, a hole injection layer is usually provided in order to decrease the voltage to be applied, to enhance the emission efficiency and to increase the useful life thereof. This hole injection layer can be formed by coating an ink comprising an associated body containing a donor molecule and an acceptor molecule, which is dispersed in water. However, there is a problem that since this hole injection layer contains a low molecular weight solid component, this solid component is permitted to reach a polymeric luminescence layer due to the diffusion of the low molecular weight solid component as the EL element is actuated for a long period of time, thereby enabling the low molecular weight solid component to function as a trapping agent or a quencher, thus leading to the deterioration of the display characteristics.

Furthermore, since the ink containing this low molecular weight solid component is liable to flocculate, there are raised various problems such as the deterioration in reproducibility of the coating for forming the film by an ink jet method thus giving rise to the generation of malfunction of display, the deterioration in flatness of the film to be obtained, or the deterioration in properties and life of the organic EL.

Additionally, if this hole injection layer is inappropriately formed, the hole injection efficiency and the hole-transporting property thereof would be deteriorated, thus deviating the carrier balance between the electrons and the holes, thus giving rise to the deterioration in life and emission efficiency of display device.

Incidentally, this organic EL (electro luminescence) element is also referred to as an organic light emitting diode element or as an organic light emitting diode. On the other hand, the organic EL display device is also referred to as an organic light emitting diode display device, as an organic light emitting display, or as an organic light emitting device. Further, the term "electro luminescence" is frequently referred to simply as "EL".

BRIEF SUMMARY OF THE INVENTION

According to one aspect of the present invention, there is provided an ink for forming a hole injection layer of organic electro luminescence display device, the ink comprising:
water; and
solid matters dispersed in the water, the solid matters containing a donor molecule comprising polythiophene and/or a derivative thereof, and an acceptor molecule comprising polystyrenesulfonic acid and/or a derivative thereof;
wherein sulfate ion is limited to 1 ppm, and components having a molecular weight of 110,000 or less is limited to 35 wt % based on an entire weight of the solid matters, the molecular weight being converted as sodium polystyrenesulfonate in an aqueous gel permeation chromatography measured by using UV of 254 nm in wavelength.

According to another aspect of the present invention, there is provided a method for preparing the ink according to one aspect of the present invention, the method comprising:
preparing a dispersion liquid comprising water, and solid matters dispersed in the water, the solid matters containing a donor molecule comprising polythiophene and/or a derivative thereof, and an acceptor molecule comprising polystyrenesulfonic acid and/or a derivative thereof; and
subjecting the dispersion liquid to at least one of dialysis and ultrafiltration to limit the concentration of sulfate ion in the ink to 1 ppm or less and to limit the ratio of components having a molecular weight of 110,000 or less to 35 wt % or less based on an entire weight of the solid matters, the molecular weight being converted as sodium polystyrenesulfonate in an aqueous gel permeation chromatography measured by using UV of 254 nm in wavelength.

According to a further aspect of the present invention, there is provided a method for manufacturing an organic electro luminescence display device provided with a two-dimensional array of pixels comprising organic electro luminescence elements capable of emitting a single color or different plural colors, each of the organic electro luminescence elements being provided with an anode, a cathode, a polymeric luminescence layer located between the anode and the cathode, and at least one organic electro luminescence element having a hole injection layer; the method comprising:
forming the hole injection layer by the coating of the ink according to one aspect of the present invention by ink jet process.

According to a further aspect of the present invention, there is provided an organic electro luminescence display device comprising:

a two-dimensional array of pixels containing organic electro luminescence elements capable of emitting a single color or different plural colors, each of the organic electro luminescence elements being provided with an anode, a cathode, a polymeric luminescence layer located between the anode and the cathode, and at least one organic electro luminescence element having a hole injection layer;

wherein the hole injection layer comprises solid matters containing a donor molecule comprising polythiophene and/or a derivative thereof, and an acceptor molecule comprising polystyrenesulfonic acid and/or a derivative thereof; a concentration of sulfate ion in the hole injection layer is limited to 125 ppm or less; and components having a molecular weight of 110,000 or less is limited to 35% or less based on an entire solid matter, the molecular weight being converted as sodium polystyrenesulfonate in an aqueous gel permeation chromatography measured by using UV of 254 nm in wavelength.

DETAILED DESCRIPTION OF THE INVENTION

Next, various embodiments of the present invention will be explained in detail with reference to drawings.

Figure 1:
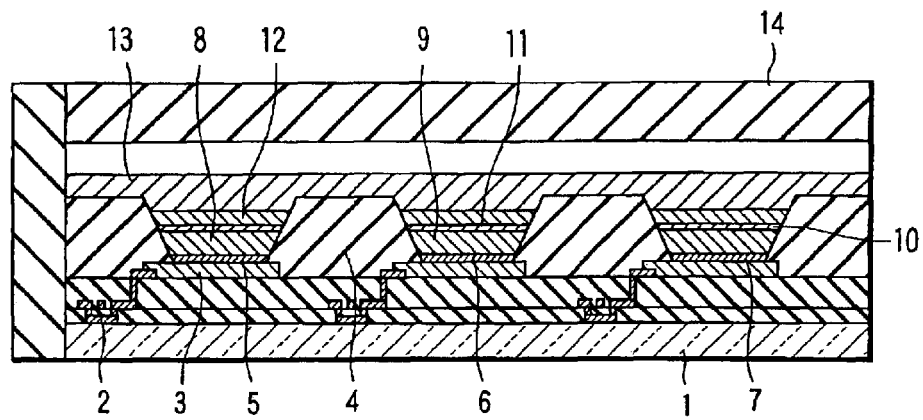
FIG. 1 shows a cross-sectional view illustrating an organic EL display device according to one embodiment of the present invention.

FIG. 1 shows a cross-sectional view illustrating one pixel of an organic EL display device according to one embodiment of the present invention. It should be understood however that the present invention is by no means restricted by the organic EL display device and the manufacturing method thereof, which are set forth in the embodiment.

Referring to FIG. 1, a partitioning wall 4 made of an insulator is formed on the surface of a transparent substrate 1 made of an insulating material such as glass. All of the cells isolated each other by the partitioning wall 4 are respectively constituted by an organic EL element exhibiting any one of three luminescence colors (red, green and blue). Namely, three organic EL elements are respectively constituted by a transparent electrode (for example, an anode) 3 such as ITO, any one of hole injection layers 5, 6 and 7, any one of polymeric luminescence layers 8, 9 and 10, a buffering layer 11, a cathode (counter electrode) 12, and a silver electrode 13, all of which being successively deposited on the substrate 1, and are isolated from each other by the partitioning wall 4. As for the polymeric luminescence layer 8, a red color emitting material is employed as a dye molecule of luminescence center, as for the polymeric luminescence layer 9, a green color emitting material is employed as a dye molecule of luminescence center, and as for the polymeric luminescence layer 10, a blue color emitting material is employed as a dye molecule of luminescence center. These organic EL elements are respectively connected with a transistor 2, and a sealing film 14 is deposited as an uppermost layer over these organic EL elements.

One pixel is constituted by three cells formed of these three organic EL elements. When a predetermined voltage is applied between the transparent electrode and the counter electrode of any one the organic EL elements, a desired color is enabled to emit from the polymeric luminescence layer 8, 9 or 10. Namely, while the holes supplied from the transparent electrode 3 are fed, via the hole injection layer 5, 6 or 7, to the polymeric luminescence layer 8, 9 or 10, the electrons supplied from the cathode 12 are enabled to reach, via the buffering layer 11, the polymeric luminescence layer 8, 9 or 10. As a result, the holes and the electrons recombine in the polymeric luminescence layer and to generate luminescence therefrom, thereby enabling a desired color to be observed from the transparent substrate 1 side. It is possible, through a two-dimentional arrangement of the pixel described above, to manufacture the organic EL (electro luminescence) display device of one embodiment of the present invention.

In this embodiment of the present invention, an ink where an associated body containing a donor molecule and an acceptor molecule is dispersed in water is employed as an ink for forming a hole injection layer (the ink may be hereinafter referred to simply as ink) of organic electro luminescence display device. The donor molecule should preferably be polythiophene and/or a derivative thereof, and the acceptor molecule should preferably be polystyrenesulfonic acid and/or a derivative thereof. More specifically, it is preferably as the donor molecule, polythiophene or poly(3,4-dialkoxythiophene).

In particular, a combination of polyethylene dioxythiophene (abbreviated herein as PEDOT) as a donor molecule and polystyrenesulfonic acid or polystyrene sulfonate (polystyrenesulfonic acid and polystyrene sulfonate are both abbreviated herein as PSS) as an acceptor molecule is preferable because of the facts that the ink derived from the combination is thermally and chemically stable, can be easily coated on the surface of substrate, is capable of forming a film (hole injection layer) having a uniform thickness, and is excellent in light transmittance.

The water for dispersing the aforementioned donor molecule and acceptor molecule may be pure water, ion-exchange water or distilled water. Further, the water may contain at least one alcohol selected from the group consisting of methanol, ethanol and isopropyl alcohol. The inclusion of alcohol in the water is preferable in the respects that the resultant mixture can be heat-treated at a relatively low temperature and that the content of water in the ink can be reduced. However, the upper limit of the content of alcohol should preferably be confined to at most 50% by weight based on the entire solvent. Because if the content of alcohol exceeds 50% by weight, the dispersibility of PEDOT·PSS ink may be degraded.

The inclusion of polyvalent ion such as sulfate ion or of low molecular weight polymers in the ink for forming the hole injection layer of organic EL element is considered to lead to the flocculation of the ink. The inclusion of the aforementioned low molecular weight components in the ink is more likely to give rise to the generation of the migration thereof inside the organic EL element, thus permitting the low molecular weight components to function as a charge trap or as a quencher, which, in turn, may become one of the causes for shortening the life of the display device.

Therefore, in the embodiments of the present invention, employed is the ink where the concentration of sulfate ions is 1 ppm or less. The concentration of sulfate ions can be measured by ion chromatography.

Further, in the embodiments of the present invention, employed is the ink which contains 35% or less, based on the entire weight of the associated body, of components having a molecular weight of 110,000 or less (when converted as sodium polystyrenesulfonate in an aqueous gel permeation chromatography obtained using UV of 254 nm in wavelength). In other words, employed the ink contains 35% or less, based on the entire polymer components, of the components which require an elution time of 16 minutes or more in the gel permeation chromatography. Namely, a molecular weight of 110,000 (when converted as sodium polystyrenesulfonate) corresponds to the elution time of 16 minutes. Incidentally, according to the gel permeation chromatography, the higher the molecular weight of the components is, the shorter the elution time is, i.e. the lower the molecular weight of the components is, the longer the elution time is. The conditions for the measurement in the gel permeation chromatography are as follows, under which conditions the following values are indicated.

Conditions for measurement:

Aqueous gel permeation chromatographic column;

Eluate: Water+Methanol (10 volume %)+0.1 mol of $Na_2SO_4$;

Developing flow rate: 1 mL/minute;

Temperature of the column: 40° C.; and

Detector: UV (254 nm).

The aqueous gel permeation chromatographic column comprising:

TSK gel (trade name) α-M; base material: vinyl polymer; particle diameter: 13 μm)×2;

Column: 7.8 mm (inner diameter)×30 cm (length);

Guaranteed theoretical plate number: 7000TP/30 cm; and

Guardcolumn TSK α, 6 mm (inner diameter)×4 cm (length), which is attached to the chromatographic column.

It is more preferable, in the embodiments of the present invention, to employ the ink which contains 30% or less, most preferably 25% or less, based on the entire associated body, of the components which require an elution time of 16 minutes or more in the gel permeation chromatography. However, if the content of the aforementioned components is less than 15%, the coating property of the ink would be deteriorated.

It has been found by the present inventors that the ink that satisfies the aforementioned conditions would be hardly flocculated through the purifying process of the dialysis or ultrafiltration, and that the organic EL element manufactured by using such an ink would be improved in useful life thereof.

The method for preparing an ink for forming a hole injection layer of organic EL display device according to one embodiment of the present invention comprises: dispersing, in water, an associated body containing a donor molecule comprising polythiophene and/or a derivative thereof, and an acceptor molecule comprising polystyrenesulfonic acid and/or a derivative thereof; and subjecting the resultant dispersion liquid to at least one of dialysis and ultrafiltration to limit the concentration of sulfate ion in the ink to 1 ppm or less and to limit the ratio of components having a molecular weight of 110,000 or less to 35 wt % or less based on the entire weight of said associated body, said molecular weight being converted as sodium polystyrenesulfonate in an aqueous gel permeation chromatography measured by using UV of 254 nm in wavelength.

It is preferable to perform the dialysis using a permeable membrane mainly composed of cellulose and characterized by a fractionating molecular weight ranging from 8,000 to 25,000. The dialysis and ultrafiltration may be employed in combination.

If the ink is conditioned to exhibit an ionization potential of higher than 5.3 eV, it would be possible to manufacture a hole injection layer having an ionization potential of higher than 5.3 eV. If so, it would become possible to obtain an organic EL display device excellent in light emitting efficiency.

The reason for making it possible to obtain an organic EL display device of high luminescence efficiency by increasing the ionization potential of the hole injection layer to 5.3 or more can be explained as follows.

In the organic EL display device, since the light that has been generated at the luminescence layer is required to be taken out of at least either the anode side or the cathode side, at least one of the anode and the cathode is required to be constituted by a transparent electrode. ITO (Indium Tin Oxide) extensively employed for this transparent electrode is relatively high in work function i.e. 5.0 and hence frequently employed on the anode side (hole injection side). In this case, the hole injection layer is interposed between the transparent electrode made of ITO and the polymeric luminescence layer.

It has been found by the present inventors that depending on the relationships among three parameters i.e. the work function of ITO, the ionization potential of the hole injection layer, and the ionization potential of the polymeric luminescence layer, the manner of injecting the hole can be altered. Namely, when the difference between the ionization potential of the hole injection layer and the work function of ITO is 0.3 eV or less, a large quantity of holes are injected into the hole injection layer from the ITO. When an associated body containing a donor molecule comprising polythiophene and/or a derivative thereof, and an acceptor molecule comprising polystyrenesulfonic acid and/or a derivative thereof is employed as a material for this hole injection layer, the hole mobility of this material is relatively low, the hole can be prevented from smoothly moving inside the hole injection layer. As a result, the hole is caused to remain inside the hole injection layer, thus resulting in a shortened useful life of display due to the deterioration of light emitting efficiency and also due to the deterioration of the hole injection layer.

To prevent the aforementioned problem, the difference between the ionization potential of the hole injection layer and the work function of ITO is required to be larger than 0.3 eV. Since the work function of ITO is 5.0 eV, a polymeric organic EL display device capable of exhibiting a high light emitting efficiency can be obtained by increasing the ionization potential of the hole injection layer larger than 5.3 eV.

However, the ionization potential of the hole injection layer is required to be smaller than the ionization potential of the polymeric luminescence layer. The reasons for this can be explained as follows. Since the difference between the ionization potential of the hole injection layer and the work function of ITO mentioned above represents the barrier height in the case that hole is moved from the ITO to the hole injection layer, the smaller this difference is, the smaller this barrier height would become. Where the ionization potential of the hole injection layer is equivalent to or larger than the ionization potential of the polymeric luminescence layer, the barrier to the injection of hole can be minimized by adopting a 2-ply structure consisting of ITO/polymeric luminescence layer rather than the ITO/hole injection layer/polymeric luminescence layer. Therefore, as long as the ionization potential is bound by the aforementioned relationships, it would be impossible to enable the hole injection layer to fulfill the role of promoting the injection of hole.

The value of the ionization potential Ip(H) of the hole injection layer should preferably be confined within the range represented by the following expression (1) by using the ionization potential of the polymeric luminescence layer Ip(E).

$$5.3 < Ip(H) < Ip(E) \qquad (1)$$

Incidentally, the ionization potential of the polymeric luminescence layer is usually in the range of 5.5 eV to 6.0 eV. According to the aforementioned expression (1), in order to enable the ink to be applicable to the polymeric luminescence layer having an ionization potential of 6.0 eV, the ionization potential of the ink should preferably be larger than 5.3 eV and smaller than 6.0 eV.

The ionization potential can be measured by ultraviolet photoelectron spectroscopy (UPS), cyclic voltammetry, eletroabsorption spectroscopy, atmospheric photoelectron spectroscopy (open-counter photoelectron spectroscopy), etc. In particular, the atmospheric photoelectron spectroscopy is advantageous in that it is easy to manufacture a specimen and also easy to perform the measurement, that it is hardly affected by the charge-up during the measurement, and that the measurement can be performed accurately.

Figure 2:
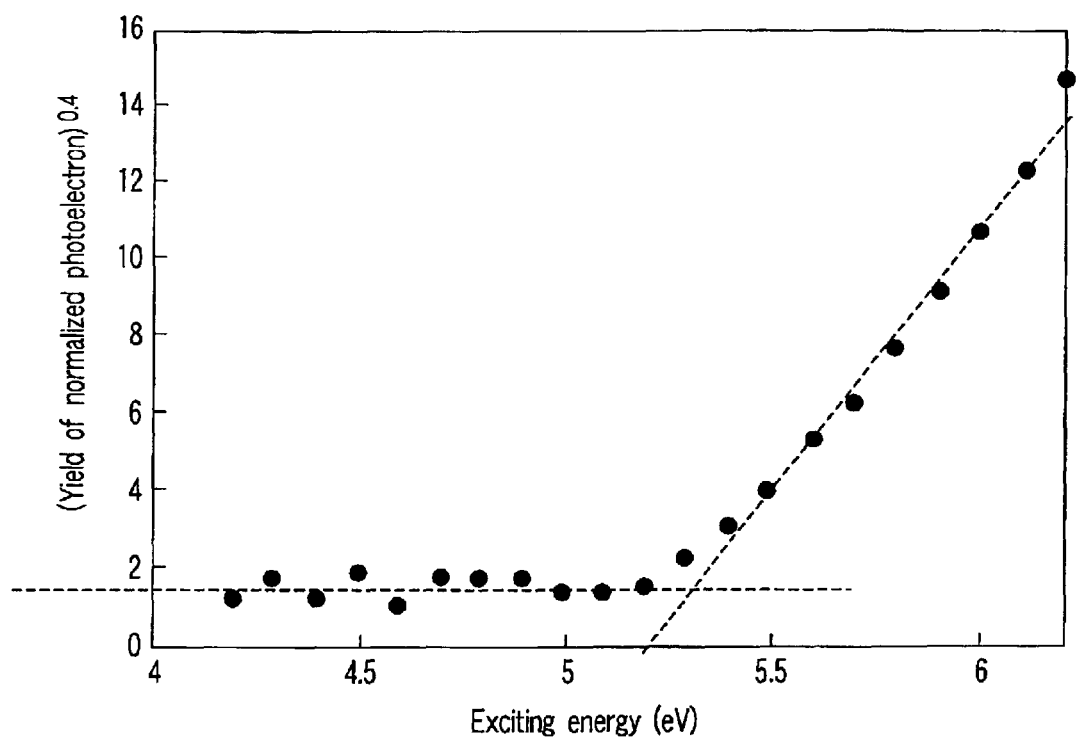
FIG. 2 is a graph for illustrating the method of measuring the ionization potential of a luminescence layer.

As for the apparatus for the atmospheric photoelectron spectroscopy, it is possible to employ AC-2 (Riken Keiki Co., Ltd.) for instance. For example, the energy of ultraviolet rays irradiated onto a specimen is changed every 0.1 eV from 4.2 to 6.2 eV, and the number of electrons emitted from the specimen is measured. The energy needed to cause electrons to emit from the specimen due to photoelectric effects is considered as being the ionization potential of the specimen. FIG. 2 illustrates the method of measuring the ionization potential. As shown in FIG. 2, in relative to the irradiation energy (wavelength) of ultraviolet ray indicated on the abscissa, the values obtained by raising the normalized yield of photoelectrons to 0.4th power are plotted on the ordinate. Then, by determining the intersection between the base line and the straight line approximately linearized, the ionization potential can be accurately measured. The values of the ionization potential set forth in the present specification are determined based on this method of measurement.

Incidentally, when the ionization potential of the ink is measured by the atmospheric photoelectron spectroscopy, the measurement can be performed after the ink is transformed into a film. Specifically, the ink for the hole injection layer is coated, by spin-coating for instance, on the surface of a glass substrate having an ITO film deposited thereon, and then, heated over a hot plate to evaporate the solvent (water) therefrom. As for the substrate, it is possible to employ a silicon substrate other than the aforementioned ITO film-attached glass substrate. The heating in this case may be performed in air atmosphere or in a nitrogen gas atmosphere using an oven for instance. Heating temperature should preferably be confined within the range of 100 to 200° C. The values of the ionization potential set forth in the present specification are determined based on the specimens which were heated for one minute in air atmosphere over a hot plate heated to 120° C. to evaporate the solvent (water) therefrom. The film thickness of the hole injection layer of the specimen on which the ionization potential is measured should preferably be within the range of 15 to 150 nm. Because if this film thickness is smaller than 15 nm, the hole injection layer may be undesirably affected by the underlying substrate.

To manufacture an ink exhibiting an ionization potential of larger than 5.3 eV, an ink comprising an aqueous dispersion of an associated body containing a donor molecule comprising polythiophene and/or a derivative thereof, and an acceptor molecule comprising polystyrenesulfonic acid and/or a derivative thereof should preferably be dialyzed by using a specific kind of permeable membrane.

More specifically, first of all, an ink is poured into a cylindrical body of permeable film and then, both ends of the cylindrical body are closed. The resultant cylindrical body is placed in a vessel filled with a large quantity of ion-exchange water and left to stand for a period ranging from several days to several scores of days to remove impurity ions having a formula weight of not higher than the fractionated molecular weight as well as unreacted oligomers having a molecular weight of not higher than the fractionated molecular weight from the ink. Since the impurities such as impurity ions and unreacted oligomers included in the ink exhibit various impurity levels, the value of ionization potential is caused to decrease. Therefore, if these impurities can be removed from the ink by dialysis, it would become possible to obtain an ink having an ionization potential of larger than 5.3 eV.

As for the permeable membrane employed in the dialysis, it is preferable to employ a permeable membrane mainly comprising regenerated cellulose (cellophane) and having a fractionating molecular weight ranging from 8,000 to 25,000 (for example, Spectra/Por (registered trademark) 4; SPECTRUM (registered trademark) LABORATORIES INC.). If the fractionated molecular weight is smaller than 8,000, it would become difficult to sufficiently remove the unreacted oligomers. On the other hand, if the fractionated molecular weight is larger than 25,000, the polymer components of the ink may be also flow out of the ink through the permeable membrane. In particular, if the permeable membrane has a fractionating molecular weight ranging from 12,000 to 14,000, it would become possible to obtain a desirable value of ionization potential by dialysis taking several days and hence desirable in viewpoint of enhancing the mass production.

Since the regenerated cellulose is capable of resisting an acid having a pH ranging from about 1 to 2.5 and hence chemically stable, there is little possibility that impurities are eluted from the permeable membrane. Therefore, the ionization potential of the ink can be controlled within a desirable range. Moreover, the permeable membrane made of the regenerated cellulose is sufficiently high in mechanical strength. Incidentally, collodion and parchment paper are not suited for use as a material for the permeable membrane in the embodiments of the present invention. Namely, if the ink is subjected to dialysis by using the permeable membrane made of any of these materials, impurities in the permeable membrane may elute to develop impurity levels, thereby making it difficult to control the ionization potential of the ink to confine within a desirable range.

As for the configuration of the permeable membrane, it is desirable to employ a cylindrical configuration in viewpoint of workability, wherein the diameter thereof should preferably be confined within the range of 15 mm to about 50 mm. If this diameter is smaller than 15 mm, the quantity of the ink per unit length of the cylindrical body which is to be subjected to the dialysis would be insufficient, so that the productivity would be deteriorated. On the other hand, if this diameter exceeds over 50 mm, the surface area of the permeable membrane relative to the quantity of the ink would become too small, thereby making it difficult to achieve a sufficiently high dialyzing efficiency.

The ink having the ionization potential of larger than 5.3 eV after the dialysis can be coated on the surface of anode by any desired method to form a hole injection layer. In this case, the coating of the ink can be performed by various methods such as an ink jet process wherein the coating of the ink is performed in the same manner as that of an ink jet printer; a dipping method wherein a substrate is dipped in a vessel which is filled with the ink and then, taken out of the vessel, superfluous ink attached to the substrate being subsequently removed; and a spin-coating method wherein the ink is coated on the surface of substrate by using a spinner. After being coated in these manners, the ink is heated by a hot plate or an oven to evaporate a solvent (water) from the coated layer to obtain a film.

In the case of an organic EL display device exhibiting a multicolor display, three pixels differing in display color such as red, green and blue are respectively constituted by a polymeric luminescence layer formed of a different material from each other. Since the ionization potential of the polymeric luminescence layer differs depending on the material employed therein, the optimum value of ionization potential of the hole injection layer is caused to differ depending on pixel (red, green or blue pixel). In this case, if the coating of the ink for forming the hole injection layer is performed by using the ink jet process, the hole injection layer exhibiting an optimum ionization potential can be easily formed for each of these different pixels.

To optimize the coating property and viscosity of the ink, a polymer formed of the same component as that of the acceptor molecule and having an average molecular weight ranging from 50,000 to 100,000,000 should preferably be incorporated in the dispersion liquid at a concentration ranging from 1% by volume to 50% by volume. This polymer can be added to the dispersion liquid prior to or subsequent to the dialysis or the ultrafiltration.

In the dialysis of the dispersion liquid, it is preferable to employ a permeable membrane having a fractionating molecular weight ranging from 8,000 to 25,000. For example, by performing a long period (about two weeks) of the dialysis operation using a large quantity of ion-exchange water and a permeable membrane made of 15961-022 (Invitrogen Life Technologies Co., Ltd.), it is possible to measure the quantity of components incapable of passing through the permeable membrane. Small solid matters passing through a permeable membrane having a fractionating molecular weight of 8,000 to 25,000, in particular, very fine associated bodies may become one of the causes for generating flocculation. Namely, since these small solid matters are poor in stability, they are liable to flocculate together. On this occasion, these small solid matters are considered to act as an adhesive to unite large associated bodies with each other. Further, when inorganic ionic components are existed in this case, the flocculation of ink may be promoted.

By removing small solid matters and inorganic ionic components by dialysis, it is possible to obtain an ink which can be hardly flocculated.

Small solid matters and inorganic ionic components in the dispersion liquid can be removed also by a process of ultrafiltration. The processes of dialysis and ultrafiltration may be employed in combination, and furthermore, another purifying process (such as ion exchange or centrifugal separation) may be combined with the dialysis and ultrafiltration.

A polymer formed of the same component as that of the acceptor molecule and having an average molecular weight ranging from 50,000 to 1,000,000 may be incorporated in the dispersion liquid that has been subjected to dialysis or ultrafiltration. Since the acceptor molecule is capable of functioning as a surfactant, the viscosity of the dispersion liquid can be enhanced. Accordingly, it is possible, by adding a suitable quantity of the acceptor molecule, to lower the surface tension of the dispersion liquid and hence to improve the coating property of the dispersion liquid.

If the average molecular weight of the polymer to be incorporated into the dispersion liquid is less than 50,000, the glass transition temperature of the polymer is decreased, so that the polymer may be heated beyond the glass transition temperature thereof on the occasion when Joule heat is generated during the actuation of a display device. On the other hand, when the display device is not actuated, the polymer is cooled to partially crystallize, thus degrading the polymer. The effect to enhance the viscosity of the dispersion liquid can be certainly promoted as the average molecular weight of the polymer is increased. However, if the average molecular weight of the polymer exceeds over 1,000,000, the dispersion stability thereof to water would deteriorate, thus generating the precipitation thereof and hence causing deterioration of the surface flatness of the hole injection layer to be obtained.

It is preferable that the polymer having an average molecular weight ranging from 50,000 to 1,000,000 is also subjected in advance to at least one of dialysis and ultrafiltration in the same manner as described above.

Further, if the mixing ratio of the polymer is less than 1% by weight, it would be impossible to realize the effect of sufficiently lowering the surface tension. As the mixing ratio of the polymer is increased, the viscosity of the resultant would be increased, thus enabling the ink to have a suitable viscosity for adopting the ink jet process. However, if the mixing ratio of the polymer becomes excessively high, the frothing property thereof would be enhanced, thereby making it impossible to achieve a stable coating of ink. Therefore, the upper limit of the content of the polymer should be set to at most 50% by weight. The ink incorporated with the polymer should preferably be such that the surface tension thereof is within the range of 20 to 65 dyn/cm, and the viscosity thereof is confined within the range of 7 to 20 mPa·s.

As described above, it is possible to perform a fine adjustment of the surface tension and viscosity of ink by the addition of an acceptor polymer to the dispersion liquid subsequent to at least one of the dialysis and the ultrafiltration of the dispersion of associated body containing a donor molecule and an acceptor molecule. As a result, it is now possible to enable the ink to have desirable coating properties. Since simply adding a polymer having the same composition as that of the acceptor molecule inherently included in the hole injection layer, the hole injection property or the life of the EL display device can never be badly affected by adding the polymer.

The ink for the hole injection layer that can be obtained by the incorporation of the polymer may be subsequently further subjected to at least one of dialysis and ultrafiltration. In that case, since minute associated body as well as low molecular weight donor molecule or low molecular weight acceptor molecule can be removed, the dispersion stability of the mixed solution or the surface flatness of the hole injection layer to be produced can be further improved. The ionic impurities can be removed more or less by the process of ion exchange, and the minute associated body can be removed more or less by the process of centrifugal separation. However, in view of the operability and mass productivity, the employment of dialysis or ultrafiltration is more preferable. In that case also, it is preferably to perform the dialysis by employing a permeable membrane mainly composed of cellulose and having a fractionating molecular weight ranging from 8,000 to 25,000. These dialysis and ultrafiltration may be employed in combination.

The inks prepared by the method set forth in the embodiments of the present invention should preferably be formulated such that the weight ratio, in the ink, of the solid matters including the polymer and the associated body containing a donor molecule and an acceptor molecule is confined within the range of 0.4 wt % to 2.8 wt %. The reasons for this will be explained as follows with reference to FIG. 3.

Figure 3:
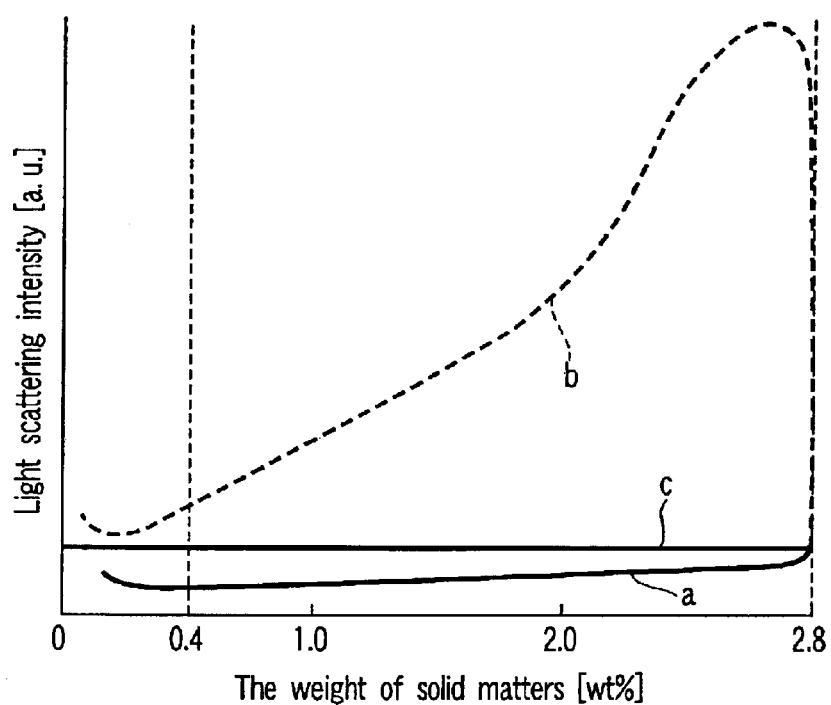
FIG. 3 is a graph for illustrating the relationship between the weight of solid matters of an ink for forming a hole injection layer of an organic EL display device and the light scattering intensity of the ink.

FIG. 3 shows a graph for illustrating the relationship between the weight of solid matters of an ink for forming a hole injection layer of organic EL display device and the light scattering intensity of the ink.

The ink employed in this case was formed of a solution of PEDOT·PSS compound represented by the following chemical formula (1) (raw liquid: 2.8 wt %). This ink was dialyzed at first and then, the interrelationship between the weight of the solid matters after the dialysis (wt %) and the light scattering intensity as measured using a particle size distribution analyzer was studied. Further, raw liquid which was the same in composition as that mentioned above but was not dialyzed as yet was diluted with pure water to the same concentration as that of the raw liquid which was already dialyzed. The weight ratio of the solid matters was measured by procedures wherein a predetermined quantity of the ink was taken and then, the ink was dried and the weight of the dried substance was measured to determine the weight ratio.

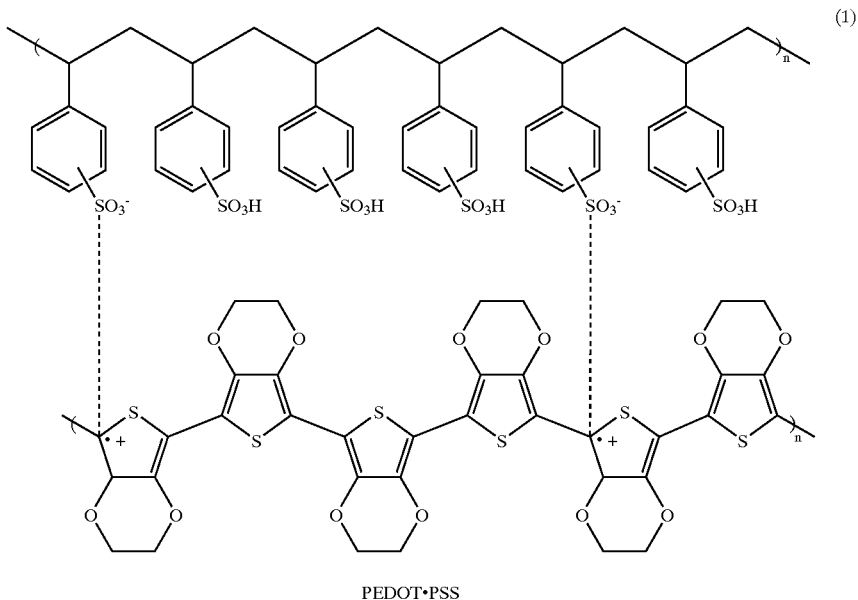

(1)

PEDOT·PSS

In the case of the ink which exhibited a large magnitude of light scattering intensity, the polymer components were flocculated in water, and this flocculation was confirmed to badly affect the surface flatness of film when the ink was formed into a thin film, thereby badly affecting the properties of the display device.

In FIG. 3, the curve "a" represents the results derived from the ink after the dialysis thereof; the curve "b" represents the results derived from the ink formed of diluted raw liquid. Further, the line "c" represents the limiting value of light scattering within which the film-forming property as well as the useful life of the ink can be desirably assured. As shown by the curve "a", the light scattering intensity of the ink after the dialysis thereof was caused to gradually decrease from that of the raw liquid (2.8 wt %) as the concentration of the solid matters was lowered. On the other hand, as shown by the curve "b", in the case of the ink formed through the dilution of raw liquid with pure water, the light scattering intensity of the ink was sharply increased as the concentration of the solid matters was lowered. When the concentration of the solid matters was further lowered, the light scattering intensity of the ink was gradually decreased. However, when the concentration of the solid matters was maintained within the range of less than 2.8 wt % and more than 0.4 wt %, the light scattering intensity of the ink was higher than that of the dialyzed ink (curve "a").

When the weight ratio of the solid matters was less than 0.4 wt %, it was difficult to smoothly discharge the ink by ink jet process due to an excessively low viscosity of the ink, and defective portions may be generated in the film to be produced.

The reference values of the light scattering intensity, and of the surface flatness and physical properties of the film formed from the ink are located at midpoint of both, and hence the ink diluted with pure water indicated a larger light scattering intensity as compared with the reference value.

The ink for the hole injection layer that has been prepared according to the method set forth in the embodiments of the present invention is featured in that the smaller the particle diameter is, the more excellent is the dispersibility. Accordingly, the hole injection layer formed by using this ink is excellent in uniformity of film quality and in uniformity of physical properties. The present inventors have found the following facts through the comparison between the distribution of particle size of the ink for the hole injection layer and the life of the organic EL element. Namely, as long as the particles of the ink meet the conditions that the peak value of the particle size distribution is not larger than 0.15 $\mu$m and the volume fraction of the molecules having a particle diameter of larger than 0.5 $\mu$m is not more than 5% based on the entire molecules, it is possible to ensure a long life of the organic EL element. If the particle size of the ink is increased beyond this zone of particle size distribution, the surface of the hole injection layer formed from the ink would become roughened, thus making it impossible to obtain excellent emission of light and giving rise to various problems such as inferior luminescence due to the deterioration of performance as a hole injection layer. It is more preferable that the ink meet the conditions that the peak value of the particle size distribution is not larger than 0.1 $\mu$m and the particle size distribution is entirely within 0.3 $\mu$m. It is most preferable that the ink ideally meet the conditions that the peak value of the particle size distribution is not larger than 0.01 $\mu$m and the particle size distribution is entirely within 0.1 $\mu$m.

Figure 4:
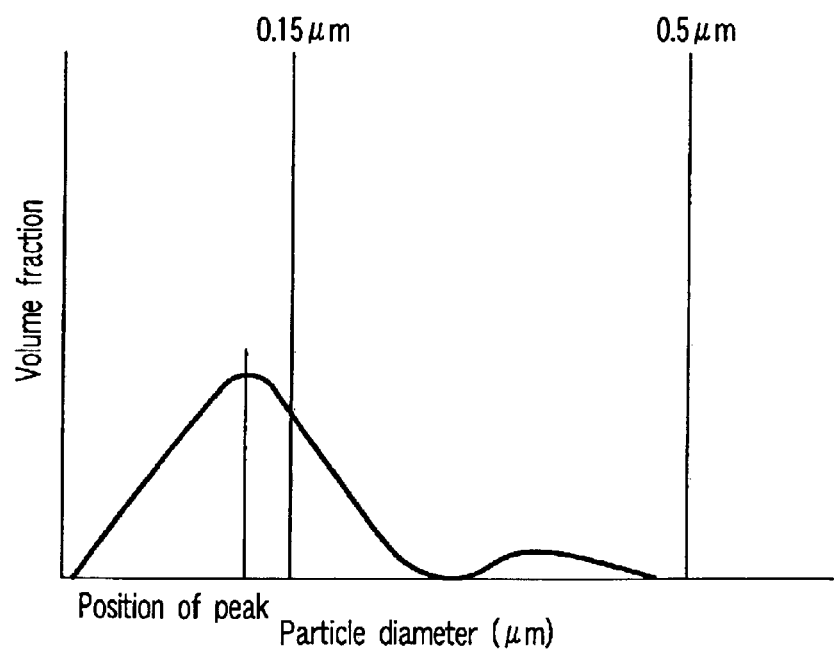
FIG. 4 is a graph for illustrating the relationship between the particle diameter of a polymer and the volume fraction of the polymer.

Incidentally, the peak value means a particle diameter as shown in FIG. 4 in the function between the particle diameter of polymeric material and the volume fraction in a dispersion liquid of polymer. If there are two or more peaks or, mathematically speaking, so-called maximum points, the point where the volume fraction is the largest is defined as peak or maximum.

Further, it is more preferable in the ink to be prepared by the method according to the embodiment of the present invention that the content of the components incapable of passing through the permeable membrane exhibiting a fractionating molecular weight of 12,000 is 50% or more, most preferably 80% or more. However, among the components capable of passing through the permeable membrane of 12,000 in fractionating molecular weight, the acceptor molecule interacts with an organic EL polymer to lower the barrier wall of hole injection, and this interaction becomes stronger as the components are constituted by those of lower molecular weight. Therefore, the content of the components incapable of passing through the permeable membrane exhibiting a fractionating molecular weight of 12,000 is preferably not larger than 95%.

As explained above, it is possible, through the inclusion of a predetermined quantity of the acceptor molecule having an average molecular weight ranging from 50,000 to 1,000,000, to provide the ink with suitable degrees of viscosity and surface tension optimal for coating by ink jet process. It is possible, through the employment of such an ink, to accurately coat the ink by ink jet process and to manufacture a hole injection layer exhibiting excellent characteristics.

Namely, in the manufacture of organic EL display device according to the embodiment of the present invention, the hole injection layer is formed by coating the aforementioned ink by using the ink jet process. In contrast to the spin coating method, this ink jet coating method is very sensitive to the viscosity of ink. If the flocculation of components happens to generate in the ink, the viscosity of the ink would be caused to change, so that the reproducibility of the coated film would be deteriorated and moreover, it may give rise to the generation of various malfunctions of coating device such as the clogging of the nozzle. Therefore, it would be very advantageous to coat the ink by ink jet process and by using an ink which can be hardly flocculated and stable for a long period of time.

Since the hole injection layer of organic electro luminescence display device according to the embodiment of the present invention is formed by using an ink which is stable and can be hardly flocculated, it is possible to minimize the non-uniformity of pixel and the generation of defectiveness. Further, since it is possible to minimize the migration of components of low molecular weight, the life of the display device can be increased. Therefore, the organic EL display device according to the embodiment of the present invention would be especially suited for the fabrication of a large display face 10 inches or more in diagonal dimension.

In the embodiments of the present invention, the thickness of the hole injection layer should preferably be within the range of 2 nm to 100 nm, more preferably 10 nm to 50 nm. If the thickness of the hole injection layer is smaller than 2 nm, it would become impossible to obtain a uniform film. On the other hand, if the thickness of the hole injection layer is larger than 100 nm, visible light may be absorbed therein and at the same time, the driving voltage may become higher in some degree.

In the embodiments of the present invention, the thickness of the polymeric luminescence layer should preferably be within the range of about 10 nm to 200 nm. If the thickness of the polymeric luminescence layer is larger than 200 nm, the driving voltage would be required to be raised, and moreover, the electron or the hole injected may be inactivated, thereby lowering the probability of the recombination of electron-hole, thus possibly deteriorating the light emitting efficiency of the polymeric luminescence layer. On the other hand, if the thickness of the polymeric luminescence layer is smaller than 10 nm, it may become difficult to obtain a uniform film and uniformity in light emitting characteristics of the pixels depending on location thereof may generate.

Although a conductive material is employed for anode and cathode in the embodiments of the present invention, the electrode disposed on the light emitting side will be formed by using a transparent material such as ITO. Although there is not any particular limitation with regard to the substrate on which the organic EL element will be formed, a transparent substrate such as glass will be employed for the substrate especially when the substrate side is employed as a light emitting face.

Next, this embodiment will be further explained in detail with reference to specific examples.

EXAMPLE (I-1)

Figure 5:
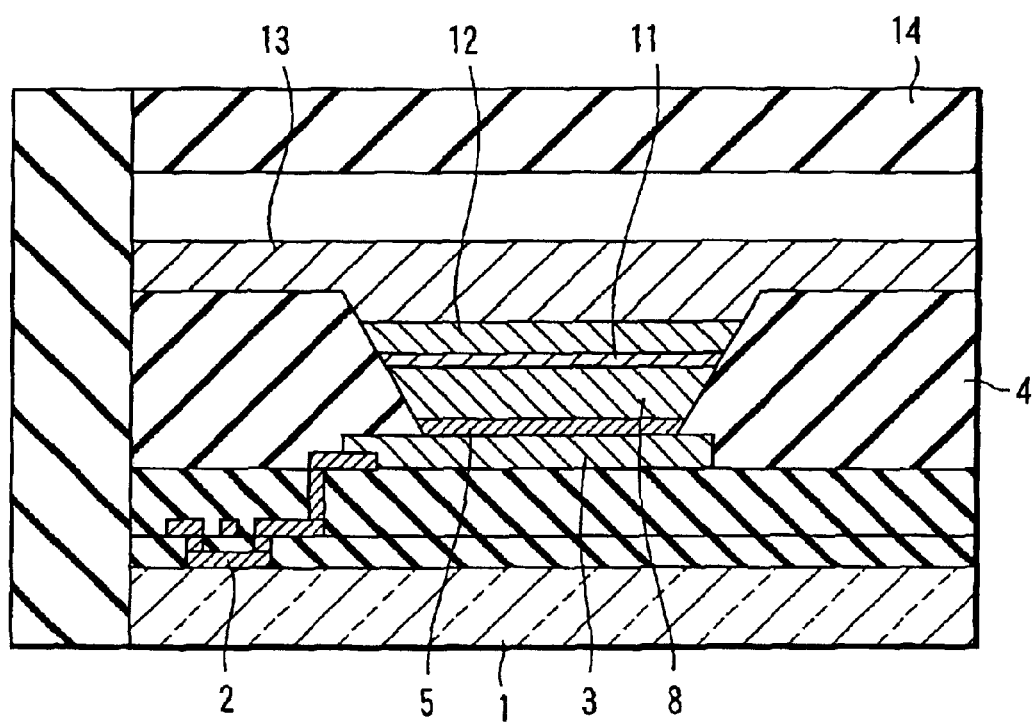
FIG. 5 shows a cross-sectional view illustrating an organic EL display element according to one embodiment of the present invention.

As shown in FIG. 5, pixels (the size of each pixel being 100 $\mu$m square) were respectively formed by using a monochromatic organic EL element to manufacture an organic EL display device having a size of 2.5 inches square, the details of which example will be explained as follows.

First of all, the following preliminary experiment was performed on the ink for forming a hole injection layer. As for the ink employed for forming a hole injection layer, a raw material comprising PEDOT·PSS compound represented by the aforementioned chemical formula (1) (BAYTRON (registered trademark) P VP CH8000; Bayer Co., Ltd.) was employed.

Figure 6:
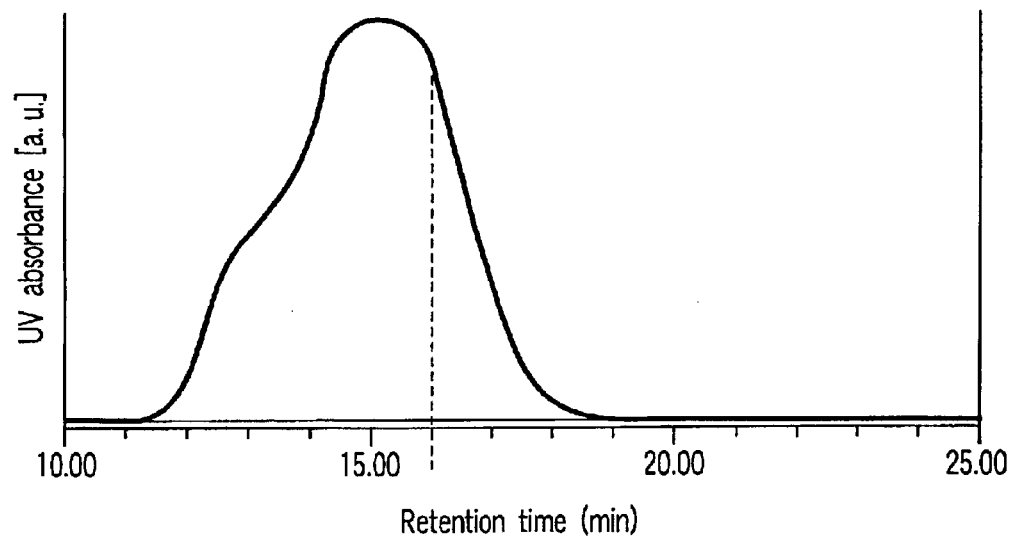
FIG. 6 is a graph for illustrating the gel permeation chromatogram of Ink A1.

This raw material for ink was treated by the methods illustrated in Table 1 to prepare various inks (A1–F1). These inks included, among the solid components, not less than 50% of the components incapable of passing through the permeable membrane having a fractionating molecular weight of 12,000. FIG. 6 shows the gel permeation chromatogram of the ink A1.

Figure 7:
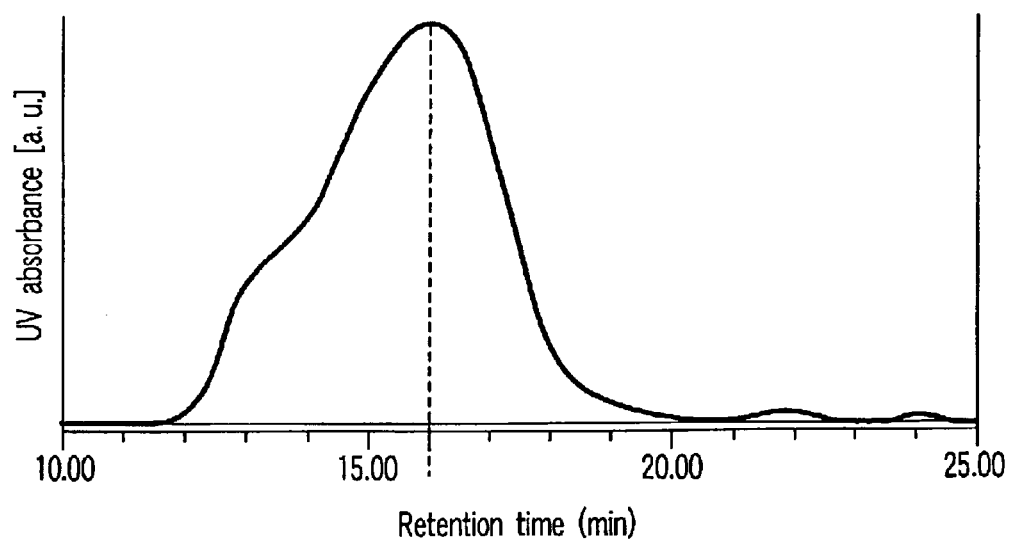
FIG. 7 is a graph for illustrating the gel permeation chromatogram of Ink G1.

For the purpose of comparison, the aforementioned raw material for ink was treated by the methods illustrated in the following Table 1 to prepare various inks (G1–J1). FIG. 7 shows the gel permeation chromatogram of the ink G1. Incidentally, the inks A1 to J1 were prepared such that after being subjected to the treatments as shown in the following Table 1, these inks were diluted using water to adjust the concentration of all of them to 0.8 wt %.

In order to examine the storage stability of these inks prepared as described above, these inks were left to stand for one week at a temperature of 50° C. and examined, through the light scattering thereof, to see if a flocculated body of larger size was caused to generate. As a result, the generation of a flocculated body of larger size was not observed in the inks of A1–F1, thus confirming excellent stability of these inks. On the other hand, the generation of a flocculated body of larger size could be observed in the inks of G1 and H1, thus confirming poor stability of these inks.

substrate 1 to obtain a film having a thickness of 50 nm. Further, by photoresist process, the barrier wall 4 having a lattice-shaped configuration was formed. Thereafter, by using any one of the inks (A1–J1), the hole injection layer 5 having a film thickness of about 20 nm was formed by ink jet process.

As a material for the polymeric luminescence layer 8, red-emitting poly[3-alkylthiophene]:PAT represented by the following chemical formula (2) was employed to form the polymeric luminescence layer 8 by ink jet process.

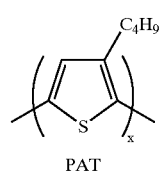

(2)

PAT

As a buffering layer 11, a film of LiF having a thickness of about 3 nm was formed by sputtering. Then, as a cathode 12, a film of Ca (calcium) having a thickness of 100 nm was deposited on the buffering layer 11. Furthermore, a silver

TABLE 1

| Ink | Method of treatment | Conc. of sulfate ions (ppm) | Component ration * (%) |
|---|---|---|---|
| A1 | Dialyzed for 7 days using a permeable membrane 12000 in fractionating molecular weight | 0.4 | 24 |
| B1 | Dialyzed for 5 days using a permeable membrane 12000 in fractionating molecular weight | 0.4 | 26 |
| C1 | Ultrafiltered using an ultrafilter membrane 12000 in fractionating molecular weight and then diluted | 1.0 | 32 |
| D1 | Dialyzed for 30 days using a permeable membrane 12000 in fractionating molecular weight | 0.3 | 14 |
| E1 | Dialyzed for 5 days using a permeable membrane 20000 in fractionating molecular weight | 0.3 | 17 |
| F1 | Dialyzed for two weeks using a permeable membrane 5000 in fractionating molecular weight | 0.3 | 35 |
| G1 | Raw liquid was diluted to obtain a solution having three times as large a volume as the initial one | 10 | 36 |
| H1 | Raw liquid differing in lot from G1 was diluted to obtain a solution having three times as large a volume as the initial one | 8 | 30 |
| I1 | Ink of G1 was dialyzed for a half day using a permeable membrane 12000 in fractionating molecular weight and then diluted | 2 | 32 |
| J1 | Raw liquid differing in lot from G1 and H1 was diluted to obtain a solution having three times as large a volume as the initial one, and then dialyzed for a full day using a permeable membrane 5000 in fractionating molecular weight | 0.8 | 38 |

* The ratio of the components where the elution time required is 16 minutes or more.

By using the aforementioned inks respectively, display devices were respectively manufactured as explained below. Incidentally, water included in the inks (A1–J1) was approximately completely removed (evaporated) in the process of forming the films thereof. As a result, the concentration of sulfate ion of the films (as a hole injection layer) can be represented by a value which can be obtained by dividing the concentration of the sulfate ion of the inks shown in Table 1 by 0.8 wt % (the concentration of the ink). Namely, since the concentration of the sulfate ion of the ink C1 was 1.0 ppm, the concentration of sulfate ion of the film thereof would become 125 ppm.

ITO (indium-tin-oxide) as a transparent conductive material for the anode 3 was deposited on the surface of glass electrode 13 having a thickness of about 300 nm was formed on the cathode 12. Finally, a sealing film 14 was deposited all over the resultant top surface to seal every pixel.

Incidentally, when the inks A1 to F1 were employed, the clogging of the ink jet nozzle was not occurred during forming a hole injection layer by ink jet process. Whereas, when the inks G1 to I1 were employed, it was required to employ a higher voltage in discharging a predetermined quantity of ink presumably due to the clogging of the ink jet nozzle in the latter half stage of forming a hole injection layer by ink jet process.

The organic EL display devices manufactured as described above were actuated at a current density of 20 mA/cm$^2$ to determine the initial luminance as well as the half life in luminance of the display devices, the results being shown in the following Table 2. It has been found that the organic EL display devices A1 to F1 where the hole injection layers thereof were formed by using the inks A1 to F1 were all excellent in useful life having a half life of not less than 10,000 hours. Whereas in the cases of the organic EL display devices G1 to J1 where the hole injection layers thereof were formed by using the inks G1 to J1, it was found that the half life in luminance thereof was all far less than 10,000 hours, thus indicating short useful life of these display devices.

TABLE 2

| Ink | Initial luminescence [Cd/m$^2$] | Half life in luminescence [hours] |
| --- | --- | --- |
| A1 | 600 | 16000 |
| B1 | 570 | 13000 |
| C1 | 620 | 11000 |
| D1 | 560 | 10000 |
| E1 | 630 | 12000 |
| F1 | 600 | 11000 |
| G1 | 620 | 1000 |
| H1 | 600 | 2000 |
| I1 | 600 | 5000 |
| J1 | 530 | 7000 |

EXAMPLE (I-2)

In this example, a trichromatic organic EL display device as shown in FIG. 1 was manufactured as explained below.

ITO (indium-tin-oxide) employed as a transparent conductive material for the anode 3 was deposited on the surface of glass substrate 1 to obtain a film having a thickness of 50 nm. Further, by photoresist process, the barrier wall 4 having a lattice-shaped configuration was formed. Thereafter, by using the ink B1 shown in Table 1, the hole injection layers 5 and 6 each having a film thickness of 20 nm were formed by ink jet process. Further, by using the ink D1 shown in Table 1, the hole injection layer 7 having a film thickness of 20 nm was formed by ink jet process.

As a material for the polymeric luminescence layer 8, red-emitting poly[3-alkylthiophene]:PAT represented by the chemical formula (2) was employed in the same manner as in Example (I-1) to form the polymeric luminescence layer 8 by ink jet process.

As a material for the polymeric luminescence layer 9, there was employed a mixture comprising a host molecule constituted by the compound represented by the following chemical formula (3), which was doped with 0.5 wt % of a dye molecule constituting the luminescence center and composed of a compound represented by the following chemical formula (4) to form the green-emitting polymeric luminescence layer 9 by ink jet process.

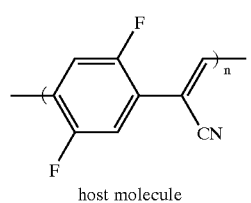

host molecule (3)

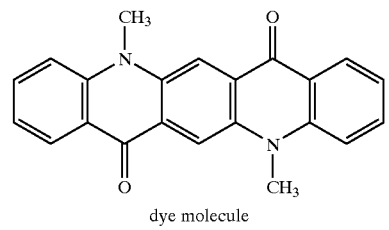

dye molecule (4)

As a material for the polymeric luminescence layer 10, blue-emitting poly[9,9'-dialkylfluorene]:PDAF represented by the chemical formula (5) was employed to form the blue-emitting polymeric luminescence layer 10 by ink jet process.

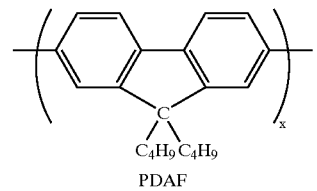

PDAF (5)

As a buffering layer 11, a film of LiF having a thickness of about 3 nm was formed by sputtering. Then, as a cathode 12, a film of Ca (calcium) having a thickness of 100 nm was deposited on the buffering layer 11. Furthermore, a silver electrode 13 having a thickness of about 300 nm was formed on the cathode 12. Finally, a sealing film 14 was deposited all over the resultant top surface to seal every pixel.

The half life in luminance of this organic EL display devices as it was actuated at a current density of 20 mA/cm$^2$ was 12000 hours.

EXAMPLE (II-1)

As shown in FIG. 5, pixels (the size of each pixel being 100 μm square) were respectively formed by using a monochromatic organic EL element to manufacture an organic EL display device having a size of 2.5 inches square, the details of which example will be explained as follows.

First of all, the following preliminary experiment was performed on the ink for forming a hole injection layer. As for the ink employed for forming a hole injection layer, a raw material comprising PEDOT·PSS compound represented by the aforementioned chemical formula (1) (BAYTRON (registered trademark) P VP CH8000; Bayer Co., Ltd.) was employed.

This raw material for ink was treated by the methods illustrated in Table 3 to prepare various ink (A2–G2). For the purpose of comparison, the aforementioned raw material for ink was treated by the methods illustrated in the following Table 3 to prepare various inks (H2–J2).

TABLE 3

| Ink | Method of treatment | Ionization potential (eV) | Conc. of sulfate ions (ppm) | Component ratio * (%) |
|---|---|---|---|---|
| A2 | Dialyzed for 28 days using a permeable membrane of regenerated cellulose 13000 in fractionating molecular weight | 5.40 | 0.2 | 13 |
| B2 | Dialyzed for 11 days using a permeable membrane of regenerated cellulose 13000 in fractionating molecular weight | 5.35 | 0.3 | 20 |
| C2 | Dialyzed for 7 days using a permeable membrane of regenerated cellulose 12000 in fractionating molecular weight | 5.33 | 0.4 | 24 |
| D2 | Dialyzed for 5 days using a permeable membrane of regenerated cellulose 12000 in fractionating molecular weight | 5.32 | 0.4 | 26 |
| E2 | Dialyzed for 5 days using a permeable membrane of regenerated cellulose 8000 in fractionating molecular weight | 5.31 | 0.9 | 33 |
| F2 | Dialyzed for 5 days using a permeable membrane of regenerated cellulose 25000 in fractionating molecular weight | 5.35 | 0.3 | 15 |
| G2 | Ultrafiltered using an ultrafilter membrane 12000 in fractionating molecular weight and then diluted | 5.31 | 1.0 | 32 |
| H2 | Raw liquid was diluted using pure water | 5.15 | 10 | 36 |
| I2 | Dialyzed for 5 days using a permeable membrane of collodion 12000 in fractionating molecular weight | the permeable membrane is broken during dialyzing | NG | NG |
| J2 | Dialyzed for 5 days using a permeable membrane of regenerated cellulose 5000 in fractionating molecular weight | 5.30 | 1.2 | 35 |

* The ratio of the components where the elution time required is 16 minutes or more.

By using the aforementioned inks respectively, display devices were respectively manufactured as explained below.

First of all, TFT 2 was formed on the surface of glass substrate 1 in accordance with the ordinary method, and then, ITO (indium-tin-oxide) as a transparent conductive material for the anode 3 was deposited on the substrate 1 to obtain a film having a thickness of 50 nm. Further, by photoresist process, the barrier wall 4 having a lattice-shaped configuration was formed. Thereafter, by using any one of the inks (A2–I2), the hole injection layer 5 having a film thickness of about 20 nm was formed by ink jet process.

As a material for the polymeric luminescence layer 8, red-emitting poly[3-alkylthiophene]:PAT represented by the aforementioned chemical formula (2) was employed to form the polymeric luminescence layer 8 by ink jet process.

As a buffering layer 11, a film of LiF having a thickness of about 3 nm was formed by sputtering. Then, as a cathode 12, a film of Ca (calcium) having a thickness of 100 nm was deposited on the buffering layer 11. Furthermore, a silver electrode 13 having a thickness of about 300 nm was formed on the cathode 12. Finally, a sealing film 14 was deposited all over the resultant top surface to seal every pixels.

The organic EL display devices that had been manufactured as described above were actuated at a current density of 20 mA/cm$^2$, thus determining the initial luminance as well as the half life in luminance of the display devices, the results being shown in the following Table 4. It has been found that the organic EL display devices A2 to G2 where the hole injection layers thereof were formed by using the inks A2 to G2 were all excellent in light emitting efficiency even after the actuation of 100 hours. Whereas in the cases of the organic EL display devices H2 to J2 where the hole injection layers thereof were formed by using the inks H2 to J2, it was found that the light emitting efficiency thereof was poor, thus indicating insufficient properties of these display devices as a display element.

TABLE 4

| Ink | Initial emitting efficiency [cd/A] | Emitting efficiency after 100 hrs. operation [cd/A] |
|---|---|---|
| A2 | 2.8 | 2.7 |
| B2 | 3.0 | 3.0 |
| C2 | 2.7 | 2.7 |
| D2 | 2.5 | 2.5 |
| E2 | 2.3 | 2.4 |
| F2 | 3.0 | 2.9 |
| G2 | 2.2 | 2.1 |
| H2 | 0.3 | 0.1 |
| I2 | — | — |
| J2 | 1.5 | 0.5 |

Incidentally, the organic EL display device J2 where the ionization potential of the hole injection layer was set to 5.3 eV was found having a useful life of as short as 1000 hours, and also too poor in uniformity of display to employ it for actual use.

EXAMPLE (II-2)

In this example, a trichromatic organic EL display device as shown in FIG. 1 was manufactured as explained below.

First of all, TFT 2 was formed on the surface of glass substrate 1 in accordance with the ordinary method, and then, ITO (indium-tin-oxide) employed as a transparent conductive material for the anode 3 was deposited on the substrate 1 to obtain a film having a thickness of 50 nm. Further, by photoresist process, the barrier wall 4 having a lattice-shaped configuration was formed. Thereafter, by using the ink D2 shown in Table 3, the hole injection layer 5 having a film thickness of 20 nm was formed by ink jet process. Further, by using the ink B2 shown in Table 3, the hole injection layers 6 and 7 each having a film thickness of 20 nm were formed by ink jet process.

As a material for the polymeric luminescence layer 8, red-emitting poly[3-alkylthiophene]:PAT represented by the chemical formula (2) was employed in the same manner as in Example 1 to form the polymeric luminescence layer 8 by ink jet process.

As a material for the polymeric luminescence layer 9, there was employed a mixture comprising a host molecule constituted by the compound represented by the aforementioned chemical formula (3), which was doped with 0.5 wt % of a dye molecule constituting the luminescence center and composed of a compound represented by the aforementioned chemical formula (4) to form the green-emitting polymeric luminescence layer 9 by ink jet process.

As a material for the polymeric luminescence layer 10, blue-emitting poly[9,9'-dialkylfluorene]:PDAF represented by the aforementioned chemical formula (5) was employed to form the blue-emitting polymeric luminescence layer 10 by ink jet process.

As a buffering layer 11, a film of LiF having a thickness of about 3 nm was formed by sputtering. Then, as a cathode 12, a film of Ca (calcium) having a thickness of 100 nm was deposited on the buffering layer 11. Furthermore, a silver electrode 13 having a thickness of about 300 nm was formed on the cathode 12. Finally, a sealing film 14 was deposited all over the resultant top surface to seal every pixels.

The light emitting efficiency of this organic EL display devices as it was actuated at a current density of 20 mA/cm$^2$ was 2.5 cd/A.

EXAMPLE (III-1)

As shown in FIG. 5, pixels (the size of each pixel being 100 μm square) were respectively formed by using a monochromatic organic EL element to manufacture an organic EL display device having a size of 2.5 inches square, the details of which example will be explained as follows.

First of all, in accordance with the formulation shown in the following Table 5, polystyrenesulfonic acid having an average molecular weight of not less than 50,000 was added to the ink A1 set forth in Example I-1 to prepare inks (A3–H3) for forming the hole injection layer of organic EL display device.

TABLE 5

| Inks | Average M. W. | Content (vol %) | Suppression of frothing | Coating property | Viscosity |
|------|---------------|-----------------|-------------------------|------------------|-----------|
| A3 | 50,000 | 5 | Δ | ○ | Δ |
| B3 | 75,000 | 5 | ○ | Δ | Δ |
| C3 | 75,000 | 10 | Δ | ○ | ○ |
| D3 | 200,000 | 3 | ○ | Δ | Δ |
| E3 | 200,000 | 5 | ○ | ○ | ○ |
| F3 | 200,000 | 10 | ○ | ○ | ○ |
| G3 | 200,000 | 30 | ○ | ○ | ○ |
| H3 | 200,000 | 50 | Δ | ○ | ○ |

○: Good,
Δ: Somewhat good

The inks A3 to H3 all contained not less than 50% (based on the entire solid components in the inks) of the components incapable of passing through a permeable membrane having by a fractionating molecular weight of 12,000.

By using the aforementioned inks respectively, display devices were respectively manufactured as explained below.

First of all, TFT 2 was formed on the surface of glass substrate 1 in accordance with the ordinary method, and then, ITO (indium-tin-oxide) as a transparent conductive material for the anode 3 was deposited on the substrate 1 to obtain a film having a thickness of 50 nm. Further, by photoresist process, the barrier wall 4 having a lattice-shaped configuration was formed. Thereafter, by using any one of the inks (A3–H3), the hole injection layer 5 having a film thickness of about 20 nm was formed by ink jet process.

As a material for the polymeric luminescence layer 8, red-emitting poly[3-alkylthiophene]:PAT represented by the aforementioned chemical formula (2) was employed to form the polymeric luminescence layer 8 by ink jet process.

As a buffering layer 11, a film of LiF having a thickness of about 3 nm was formed by sputtering. Then, as a cathode 12, a film of Ca (calcium) having a thickness of 100 nm was deposited on the buffering layer 11. Furthermore, a silver electrode 13 having a thickness of about 300 nm was formed on the cathode 12. Finally, a sealing film 14 was deposited all over the resultant top surface to seal every pixels.

When this organic EL display devices manufactured as described above was actuated at a current density of 20 mA/cm$^2$, the half life thereof was found not less than 10,000 hours.

Comparative Example

First of all, the compounds described in Table 6 were respectively added to a raw material comprising PEDOT·PSS compound represented by the aforementioned chemical formula (1) (BAYTRON (registered trademark) P VP CH8000; Bayer Co., Ltd.) to prepare the inks (I3–K3) for forming the hole injection layer of organic EL display device.

Various organic EL display devices were manufactured in the same manner as described in the aforementioned Example (III-1) except that the inks (I3–K3) shown in the following Table 6 were employed for forming the hole injection layers. Incidentally, the inks J3 and K3 shown in this Table 6 were prepared to have a viscosity and a surface tension which enable the inks to be coated by ink jet process.

TABLE 6

| Ink | Additives | Results |
|-----|-----------|---------|
| I3 | None | Unstable discharge and wettability lowered |
| J3 | PEG added | Life decreased to 1000 hrs. |
| K3 | Surfynol 104 added | Life decreased to 500 hrs. |

As a result, the ink I3 was found insufficient in wettability to the surface of substrate and also unstable in the manner of discharging of ink as the ink I3 was coated by ink jet coating method. The ink J3 contained PEG (polyethylene glycol) so as to increase the viscosity thereof. Although this ink J3 indicated improvement in stability of discharging from the nozzle, the life of the ink J3 was confirmed to decrease due to the deterioration of hole injecting property thereof. Further, the ink K3 contained Surfynol 104 (available from Air Products and Chemicals Co., Ltd.) so as to improve the wettability thereof to the substrate. Although it was possible, with the employment of this ink K3, to uniformly spread the ink all over the substrate and to enhance the discharge stability thereof, the life of the ink K3 was found decreased, as in the case of the ink J3, due to the deterioration of hole injecting property thereof.

EXAMPLE (III-2)

In this example, a trichromatic organic EL display device as shown in FIG. 1 was manufactured as explained below.

First of all, TFT 2 was formed on the surface of glass substrate 1 in accordance with the ordinary method, and then, ITO (indium-tin-oxide) employed as a transparent conductive material for the anode 3 was deposited on the substrate 1 to obtain a film having a thickness of 50 nm. Further, by photoresist process, the barrier wall 4 having a lattice-shaped configuration was formed. Thereafter, by using the ink E3 shown in Table 5, the hole injection layers 5, 6 and 7 each having a film thickness of 20 nm were formed by ink jet process. In this case, the discharge of the ink was found stable, and the spreadability of the ink after the application thereof onto the substrate was also found excellent.

As a material for the polymeric luminescence layer 8, red-emitting poly[3-alkylthiophene]:PAT represented by the chemical formula (2) was employed in the same manner as in Example (III-1) to form the polymeric luminescence layer 8 by ink jet process.

As a material for the polymeric luminescence layer 9, there was employed a mixture comprising a host molecule constituted by the compound represented by the aforementioned chemical formula (3), which was doped with 0.5 wt % of a dye molecule constituting the luminescence center and composed of a compound represented by the aforementioned chemical formula (4) to form the green-emitting polymeric luminescence layer 9 by ink jet process.

As a material for the polymeric luminescence layer 10, blue-emitting poly[9,9'-dialkylfluorene]:PDAF represented by the aforementioned chemical formula (5) was employed to form the blue-emitting polymeric luminescence layer 10 by ink jet process.

As a buffering layer 11, a film of LiF having a thickness of about 3 nm was formed by sputtering. Then, as a cathode 12, a film of Ca (calcium) having a thickness of 100 nm was deposited on the buffering layer 11. Furthermore, a silver electrode 13 having a thickness of about 300 nm was formed on the cathode 12. Finally, a sealing film 14 was deposited all over the resultant top surface to seal every pixels.

When this organic EL display device was actuated at a current density of 20 mA/cm$^2$, the half life in luminance of the display device was 12,000 hours. Further, non-uniformity of display which might have been caused due to the ink jet process was not recognized at all, thus realizing the formation of film of excellent quality by ink jet process.

EXAMPLE (III-3)

The ink (A3) shown in the aforementioned Table 5 was subjected to the treatments shown in the following Table 7 to obtain the inks A4 to F4. By using only the PEDOT·PSS compound, a raw solution of ink containing 2.8 wt % of solid matters was prepared. Then, by using this raw solution of ink, inks G4 to I4 were prepared.

Then, the inks of J4, K4 and L4 were prepared according to the following procedures.

J4: By using a permeable membrane having a fractionating molecular weight of 12,000, a raw material comprising PEDOT·PSS compound (BAYTRON (registered trademark) P VP CH8000; Bayer Co., Ltd.) was subjected to dialysis for seven days. On the other hand, polystyrenesulfonic acid having an average molecular weight of 50,000 was also subjected to dialysis under the same conditions as described above, and then, added to the aforementioned raw material which had been dialyzed in advance at a ratio of 5% by volume.

K4: By using a permeable membrane having a fractionating molecular weight of 12,000, a raw material comprising PEDOT·PSS compound (BAYTRON (registered trademark) P VP CH8000; Bayer Co., Ltd.) was subjected to dialysis for seven days. Then, polystyrenesulfonic acid having an average molecular weight of 50,000 was added to the aforementioned raw material which had been dialyzed in advance at a ratio of 5% by volume. Then, the resultant mixture was again subjected to dialysis under the same conditions as described above.

L4: Polystyrenesulfonic acid having an average molecular weight of 50,000 was added to a raw material comprising PEDOT·PSS compound (BAYTRON (registered trademark) P VP CH8000; Bayer Co., Ltd.). Then, the resultant mixture was subjected to dialysis for seven days by using a permeable membrane having a fractionating molecular weight of 12,000.

All of the inks A4 to L4 were investigated to determine the concentration of sulfate ion and the ratio of the components which required an elution time of 16 minutes or more, the results being summarized together with the treating methods and the weight of solid matters in the following Table 7.

TABLE 7

| Ink | Method of treatment | Solid matters (tw %) | Conc. of sulfate ions (ppm) | Component ratio * (%) |
|---|---|---|---|---|
| A4 | Dialyzed for 7 days using a permeable membrane 12000 in fractionating molecular weight | 1.55 | 0.9 | 24 |
| B4 | Dialyzed for 5 days using a permeable membrane 12000 in fractionating molecular weight | 0.85 | 0.5 | 26 |
| C4 | Ultrafiltered using an ultrafilter membrane 12000 in fractionating molecular weight and then diluted | 0.75 | 1.0 | 32 |
| D4 | Dialyzed for 5 days using a permeable membrane 20000 in fractionating molecular weight | 0.80 | 0.3 | 17 |
| E4 | Dialyzed for two weeks using a permeable membrane 5000 in fractionating molecular weight | 0.65 | 0.3 | 35 |

TABLE 7-continued

| Ink | Method of treatment | Solid matters (tw %) | Conc. of sulfate ions (ppm) | Component ratio * (%) |
|---|---|---|---|---|
| F4 | Filtrate was removed using centrifugal separation (5000 rpm) and then diluted | 0.75 | 0.5 | 34 |
| G4 | Raw liquid | 2.8 | 40 | 36 |
| H4 | Raw liquid was diluted with pure water and then left to stand for 3 days | 0.8 | 30 | 36 |
| I4 | Dialyzed for 20 days using a permeable membrane 20000 in fractionating molecular weight | 0.09 | 30 | 30 |
| J4 | As described above | 1.3 | 0.4 | 24 |
| K4 | As described above | 1.4 | 0.5 | 26 |

* The ratio of the components where the elution time required is 16 minutes or more.

In order to examine the storage stability of these inks prepared as described above, these inks were left to stand for one week at a temperature of 50° C. and examined, through the light scattering thereof, to see if a flocculated body of larger size was caused to generate. As a result, the generation of a flocculated body of larger size was not observed in the inks of A4–F4 and J4–L4, thus confirming excellent stability of these inks. On the other hand, the generation of a flocculated body of larger size could be observed in the inks of G4 and H4, thus confirming poor stability of these inks.

By using the aforementioned inks respectively, display devices were respectively manufactured in the same manner as explained in the aforementioned Example (III-1).

Incidentally, when the inks A4–F4 and J4–L4 were employed, the clogging of the ink jet nozzle was not occurred during forming a hole injection layer by ink jet process. Whereas, when the inks G4 to I4 were employed, it was required to employ a higher voltage in discharging a predetermined quantity of ink presumably due to the clogging of the ink jet nozzle in the latter half stage of forming a hole injection layer by ink jet process.

The organic EL display devices that had been manufactured as described above were actuated at a current density of 20 mA/cm² to determine the initial luminance as well as the half life in luminance of the display devices, the results being shown in the following Table 8. It has been found that the organic EL display devices A4 to F4 and J4 to L4 where the hole injection layers thereof were formed by using the inks A4–F4, J4–L4 were all excellent in useful life having a half life of not less than 10,000 hours. Whereas in the cases of the organic EL display devices G4 to I4 where the hole injection layers thereof were formed by using the inks G4 to I4, it was found that the half life in luminance thereof was all far less than 5000 hours, thus indicating short useful life of these display devices.

TABLE 8

| Ink | Initial luminescence [Cd/m²] | Half life in luminescence [hours] |
|---|---|---|
| A4 | 600 | 15000 |
| B4 | 570 | 13000 |
| C4 | 620 | 11000 |
| D4 | 560 | 22000 |
| E4 | 630 | 10000 |
| F4 | 600 | 11000 |
| G4 | 620 | 1000 |
| H4 | 600 | 3000 |
| I4 | 500 | 2000 |

TABLE 8-continued

| Ink | Initial luminescence [Cd/m²] | Half life in luminescence [hours] |
|---|---|---|
| J4 | 630 | 10000 |
| K4 | 620 | 10000 |
| L4 | 560 | 10000 |

The ink H4 was the same in concentration with the ink D4 which was dialyzed. While this dialyzed ink D4 exhibited the highest life among all of the specimens shown in Table 8, the life of the ink H4 was as short as 3000 hours. Further, the ink I4 which was dialyzed but was especially low in concentration of solid matters was low in initial luminescence and short in life. The reasons for this can be presumably attributed to the fact that due to an excessively small film thickness, the resultant film was inevitably accompanied with defective portions.

EXAMPLE (III-4)

A trichromatic organic EL display device as shown in FIG. 1 was manufactured in the same manner as described in the aforementioned Example (III-2) except that the ink B4 shown in Table 7 was employed for forming the hole injection layers 5 and 6, and the ink D4 was employed for forming the hole injection layer 7.

When this organic EL display device was actuated at a current density of 20 mA/cm², the half life in luminance of the display device was 12,000 hours.

As described above, according to the present invention, it is possible to provide an ink for forming a hole injection layer of organic EL display device, which makes it possible to manufacture an organic EL element which is excellent in hole injection property, can be hardly flocculated, and is long in useful life, to provide the manufacturing method thereof, to provide the method of manufacturing an organic EL display device having the aforementioned excellent features, and hence to provide such an organic EL display device.

Additional advantages and modifications will readily occur to those skilled in the art. Therefore, the invention is its broader aspects is not limited to the specific details and representative embodiments shown and described herein. Accordingly, various modifications may be made without departing from the spirit or scope of the general inventive concept as defined by the appended claims and their equivalents.

What is claimed is:

1. An ink for forming a hole injection layer of an organic electro luminescence display device, said ink comprising:
    water; and
    solid matters dispersed in said water, said solid matters containing a donor molecule comprising polythiophene and/or a derivative thereof, and an acceptor molecule comprising polystyrenesulfonic acid and/or a derivative thereof;
    wherein sulfate ion is limited to 1 ppm, and components having a molecular weight of 110,000 or less is limited to 35 wt % based on an entire weight of said solid matters, said molecular weight being converted as sodium polystyrenesulfonate in an aqueous gel permeation chromatography measured by using UV of 254 nm in wavelength.

2. The ink according to claim 1, wherein an ionization potential of said ink is larger than 5.3 eV.

3. A method for preparing an ink, said method comprising:
    preparing a dispersion liquid comprising water, and solid matters dispersed in said water, said solid matters containing a donor molecule comprising polythiophene and/or a derivative thereof, and an acceptor molecule comprising polystyrenesulfonic acid and/or a derivative thereof; and
    subjecting said dispersion liquid to at least one of dialysis and ultrafiltration to limit the concentration of sulfate ion in said ink to 1 ppm or less and to limit the ratio of components having a molecular weight of 110,000 or less to 35 wt % or less based on an entire weight of said solid matters, said molecular weight being converted as sodium polystyrenesulfonate in an aqueous gel permeation chromatography measured by using UV of 254 nm in wavelength.

4. The method according to claim 3, wherein said dialysis is performed by using a permeable membrane mainly comprising cellulose and having a fractionating molecular weight ranging from 8,000 to 25,000.

5. The method according to claim 3, wherein an ionization potential of said ink is made larger than 5.3 eV by said dialysis.

6. The method according to claim 3, further comprising incorporating a polymer in said dispersion liquid at a concentration ranging from 1% by weight to 50% by weight, said dispersion liquid having been subjected in advance to at least one of dialysis and ultrafiltration, and said polymer being formed of said same component as that of said acceptor molecule and having an average molecular weight ranging from 50,000 to 1,000,000.

7. The method according to claim 6, further comprising dialyzing said dispersion liquid incorporated with said polymer.

8. The method according to claim 6, further comprising formulating said ink in such a manner that the weight ratio of a mixture including said polymer and said solid matters is within the range of 0.4 wt % to 2.8 wt %.

9. The method according to claim 6, further comprising formulating said ink in such a manner that a peak value in a particle size distribution of a mixture including said polymer and said solid matters is limited to 0.15 μm or less, and that a volume fraction of said mixture having a particle diameter of more than 0.5 μm is set to 5% or less.

10. The method according to claim 3, further comprising:
    dialyzing a polymer dispersion liquid containing a polymer at a concentration ranging from 1% by weight to 50% by weight, said polymer being formed of said same component as that of said acceptor molecule and having an average molecular weight ranging from 50,000 to 1,000,000; and
    forming a liquid mixture by adding said dialyzed polymer dispersion liquid to said dispersion liquid that has been subjected in advance to at least one of the dialysis and the ultrafiltration.

11. The method according to claim 10, further comprising dialyzing said liquid mixture.

12. The method according to claim 10, further comprising formulating said liquid mixture in such a manner that the weight ratio of said solid matters and said polymer is within the range of 0.4 wt % to 2.8 wt %.

13. The method according to claim 10, further comprising formulating said liquid mixture in such a manner that a peak value in a particle size distribution of said solid matters and said polymer is limited to 0.15 μm or less, and that a volume fraction of said solid matters having a particle diameter of more than 0.5 μm is set to 5% or less.

14. The method according to claim 3, further comprising incorporating a polymer in said dispersion liquid at a concentration ranging from 1% by weight to 50% by weight, said dispersion liquid before subjected before to at least one of dialysis and ultrafiltration, and said polymer being formed of the same component as that of the acceptor molecule and having an average molecular weight ranging from 50,000 to 1,000,000.

15. A method for manufacturing an organic electro luminescence display device provided with a two-dimensional array of pixels comprising organic electro luminescence elements capable of emitting a single color or different plural colors, each of said organic electro luminescence elements being provided with an anode, a cathode, a polymeric luminescence layer located between said anode and said cathode, and at least one organic electro luminescence element having a hole injection layer; said method comprising:
    forming said hole injection layer by the coating of said ink according to claim 1 by ink jet process.

16. The method according to claim 15, wherein an ionization potential of said ink is larger than 5.3 eV.

17. An organic electro luminescence display device comprising:
    a two-dimensional array of pixels containing organic electro luminescence elements capable of emitting a single color or different plural colors, each of said organic electro luminescence elements being provided with an anode, a cathode, a polymeric luminescence layer located between said anode and said cathode, and at least one organic electro luminescence element having a hole injection layer;
    wherein said hole injection layer comprises solid matters containing a donor molecule comprising polythiophene and/or a derivative thereof, and an acceptor molecule comprising polystyrenesulfonic acid and/or a derivative thereof; a concentration of sulfate ion in said hole injection layer is limited to 125 ppm or less; and components having a molecular weight of 110,000 or less is limited to 35% or less based on an entire solid matter, said molecular weight being converted as sodium polystyrenesulfonate in an aqueous gel permeation chromatography measured by using UV of 254 nm in wavelength.

18. The organic electro luminescence display device according to claim 17, wherein said anode is formed of a transparent electrode, and said hole injection layer has an ionization potential falling within the range defined by the following expression (1):

$$5.3 < Ip(H) < Ip(E) \tag{1}$$

(wherein Ip(H) is the ionization potential (eV) of said hole injection layer; and Ip(E) is the ionization potential (eV) of said polymeric luminescence layer).

* * * * *

UNITED STATES PATENT AND TRADEMARK OFFICE
CERTIFICATE OF CORRECTION

PATENT NO. : 6,811,897 B2
DATED : November 2, 2004
INVENTOR(S) : Naito et al.

It is certified that error appears in the above-identified patent and that said Letters Patent is hereby corrected as shown below:

<u>Title page,</u>
Item [57], ABSTRACT,
Line 4, change "a of color" to -- a color --.
Line 15, change "matters," to -- matter, --.

<u>Column 28,</u>
Line 18, change "subjected before to" to -- subjected to --.

Signed and Sealed this

First Day of February, 2005

JON W. DUDAS
*Director of the United States Patent and Trademark Office*